United States Patent
Ramm (10) Patent No.: US 6,448,174 B1
(45) Date of Patent: Sep. 10, 2002

(54) WIRING METHOD FOR PRODUCING A VERTICAL, INTEGRATED CIRCUIT STRUCTURE AND VERTICAL, INTEGRATED CIRCUIT STRUCTURE

(75) Inventor: Peter Ramm, Pfaffenhofen (DE)

(73) Assignee: Fraunhofer-Gesellschaft Zur Forderung der Angewandten Forschung E. V., Munich (DE)

( * ) Notice: Subject to any disclaimer, the term of this patent is extended or adjusted under 35 U.S.C. 154(b) by 0 days.

(21) Appl. No.: 09/647,012

(22) PCT Filed: Mar. 25, 1999

(86) PCT No.: PCT/DE99/00906

§ 371 (c)(1),
(2), (4) Date: Oct. 5, 2000

(87) PCT Pub. No.: WO99/49509

PCT Pub. Date: Sep. 30, 1999

(30) Foreign Application Priority Data

Mar. 26, 1998 (DE) .......................... 198 13 239

(51) Int. Cl.[7] ................... H01L 21/4763; H01L 21/30; H01L 21/46; H01L 21/44; H01L 21/48
(52) U.S. Cl. .................. 438/637; 438/107; 438/455; 438/622
(58) Field of Search .................. 438/455–459, 438/462, 107–109, 118, 618, 622, 628, 629, 637, 644, 977

(56) References Cited

U.S. PATENT DOCUMENTS

| 5,276,338 | A |   | 1/1994 | Beyer et al. |
| 5,380,681 | A | * | 1/1995 | Hsu ........................... 437/209 |
| 5,442,236 | A |   | 8/1995 | Fukazawa |
| 5,767,001 | A | * | 6/1998 | Bertagnolli et al. ........ 438/455 |
| 5,846,879 | A |   | 12/1998 | Winnerl et al. |
| 5,851,894 | A | * | 12/1998 | Ramm ........................ 438/311 |
| 5,877,034 | A | * | 3/1999 | Ramm et al. ................. 438/15 |
| 5,902,118 | A | * | 5/1999 | Hubner ....................... 438/106 |
| 6,294,829 | B1 | * | 9/2001 | Liu ............................. 257/723 |

FOREIGN PATENT DOCUMENTS

| DE | 4314913 | 8/1994 |
| DE | 4433846 | 3/1996 |
| DE | 19516487 | 7/1996 |
| JP | 63213943 | 9/1988 |

OTHER PUBLICATIONS

Kuhn, Stefan A. et al., "Interconnect Capacitances, Crosstalk, and Signal Delay in Vertically Integrated Circuits", IDEM 95–249, 10.3.1, Siemens AG, Corporate R&D, Institute for Integrated Cirusits, Fraunhofer Institute for Solid State Technology.

* cited by examiner

Primary Examiner—John F. Niebling
Assistant Examiner—Viktor Simkovic
(74) Attorney, Agent, or Firm—Weingarten, Schurgin, Gagnebin & Lebovici LLP (57) ABSTRACT

The invention relates to a wiring method for vertical system integration. According to the method described in the invention, the individual component layers in different substrates are first processed independently of each other in accordance with the state of the art (DE 44 33 846 A1) and then assembled. First, via holes are opened up on the front side of the top substrate which preferably pass through all the component layers present. The top substrate is then thinned from the rear side as far as the via holes, after which a fully processed bottom substrate is joined to the top substrate. Next, the via holes are extended (so-called interchip via holes) as far as a metallized level of the bottom substrate and the contact between the top and bottom substrates is established (wiring). According to the present invention the wiring is carried out in a way which allows for a maximum density of the vertical contacts between the metallization of the top substrate and that of the bottom substrate.

31 Claims, 8 Drawing Sheets

WIRING METHOD FOR PRODUCING A VERTICAL, INTEGRATED CIRCUIT STRUCTURE AND VERTICAL, INTEGRATED CIRCUIT STRUCTURE

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

This invention concerns a wiring method for producing a vertical integrated circuit structure. More specifically, the invention concerns a wiring method for vertical system integration.

A method for producing a vertical integrated circuit structure is known from German unexamined patent application DE 44 38 846 A1. In that method, first of all, the individual layers of components are processed on different substrates, independent of one another, and then joined together. First, via holes that go through all existing layers of the components are opened on the front of the top substrate. After that, the top substrate is thinned from the back as far as the via holes. Then, a finished bottom substrate is connected to the top substrate. After that, the via holes are extended as far as the metallization level on the bottom substrate (so-called interchip via holes), and, by filling the via hole with metallic material and structuring the metallic material on the surface of the chip stack so there is a connection between the via hole and the contact area on the uppermost metallization level, the contact between the top and bottom substrate is created (wiring).

The disadvantage of this method is, however, the fact that the integration density is not satisfactory.

The goal of this invention is therefore to provide a CMOS-compatible method for vertical system integration with freely selectable vertical contacts located between circuit structures of layers of components that have been joined together, which makes high integration density and low production costs possible. The goal of the invention is also to provide a vertical, integrated circuit structure with high integration density that can be produced simply.

This invention creates a wiring method for: producing a vertical integrated-circuit structure, with steps for providing a first substrate, which contains, in the first main area, one or more initial layers with circuit structures, and at least one uppermost metallization level with contact areas; opening via holes, in a first step, in the first main area of the first substrate; providing a second substrate, which contains, in the second main area, at least one layer with circuit structures and at least one metallization level; connecting the first substrate to the second substrate, so that the side of the first substrate opposite the first main area, and the side of the second main area of the second substrate are joined together in alignment; opening the existing via holes up to a predetermined metallization level of the second substrate; producing an electrically conductive connection between the first metallization level of the first substrate and the predetermined metallization level of the second substrate, so that via holes are opened in such a way that the via holes abut the contact areas of the uppermost metallization level of the first substrate.

This invention also creates a wiring method for producing a vertical integrated-circuit structure with steps for providing a first substrate that contains, in the first main area, one or more initial layers with circuit structures, and whose uppermost metallization level is not completed; for opening via holes in a first step in the first main area of the first substrate; for providing a second substrate that contains, in the second main area, at least one layer with circuit structures, and at least one metallizing layer; for connecting the first substrate to the second substrate, so that the side of the first substrate opposite that of the first main area and the side of the second main area of the second substrate are joined together in alignment; in a second step, opening the existing via holes as far as a predetermined metallization level of the second substrate; inserting a metallic material into the via holes; and selective metallization of the surface, as a result of which an uppermost metallization level of the first substrate is brought into contact with the predetermined metallization level of the second substrate by means of the metallic material in the via holes, in the course of which, the via holes are opened in such a way that the via holes abut the contact areas of the uppermost metallization level provided.

In the method in the invention, the individual layers of components are processed independent of each other on different substrates and then joined together. First of all, the substrate that has been finish-processed (the first substrate, hereinafter referred to as the top substrate), is equipped, at those points along the front with one or more layers of components and metallization levels, whose layers of structural elements, in the finished, vertically integrated microelectronic system, will be above the layers of the components of an additional substrate (second substrate, hereinafter referred to as the bottom substrate), with via holes at those points on the front at which vertical contact with the layers of components on the bottom substrate, which are under it, will be produced later.

The method differs from the state of the art known in unexamined patent application DE 44 38 846 A1, in that in the invention, the via holes penetrate structures of the uppermost metallization level. Preferably, they also penetrate all layers of components and metallization levels present in the top substrate. The via holes preferably end a few micrometers beneath the layers of the components on the top substrate, when an SOI substrate is used, preferably at the buried oxide layer. If the etching technique used here and later makes it necessary, the top substrate can be equipped with a so-called hard mask before the via holes are produced.

After the via holes are opened, the top substrate can be thinned from the back. Thinning can be done by wet chemical etching, and/or by mechanical, and/or by chemical-mechanical grinding, for example, so that, if necessary, the top substrate is mechanically stabilized with an auxiliary substrate applied to the front by means of an adhesive layer (handling substrate). In the process, the adhesive layer can have a passivating and/or planarizing function. However, thinning can also be done without using a handling substrate. For example, using current techniques, it is possible to thin the top substrate to a residual thickness of up to 50 $\mu$m without using the handling substrate.

When using an SOI substrate, the buried layer of insulation can serve to good advantage as an etching stop during thinning. When using a conventional substrate (made of so-called bulk material), thinning can be done up to the via holes, so that afterward, they are open toward both sides of the top substrate.

Alternatively, it is naturally also possible to use a thin top substrate a priori, so there is no need for more thinning.

Then, another finish-processed substrate with one or more layers of components and metallization levels, the bottom substrate, is connected to the top substrate. For this, without imposing limitations in any general way, the front of the bottom substrate and/or the back of the top substrate can be equipped with a transparent adhesive layer. The adhesive layer can simultaneously perform a passivating and/or planarizing function. Then the top substrate and the bottom substrate are aligned to one another, and the back of the top substrate is connected to the front of the bottom substrate.

It is an advantage if alignment is done with split optics using alignment marks in the visible spectral range. Preferably, the alignment marks are made on the top substrate like the via holes by opening corresponding alignment structures from the front through all component layers of the top substrate. The alignment marks on the bottom substrate can be contained in the uppermost metallization level of the bottom substrate.

After the top and bottom substrate are joined together, the handling substrate that was used is removed, if necessary.

The existing stack of substrates can then be processed further as a standard substrate. The via holes already present are now extended from the front of the top substrate through the remaining layers (for example, the oxide layer of the SOI top substrate, the adhesive layer, the passivating layer of the bottom substrate) as far as the metallizing layer of a metallization level on the bottom substrate (by dry etching, for example), so that, if necessary, the hard mask of the top substrate serves as an etching mask. Finally, an electrical contact is made between the metal coating on the uppermost metallization level of the top substrate and the metallization level of the bottom substrate through these via holes.

For that purpose, this invention describes a new type of wiring method that leads to a marked increase in integration density, specifically for vertical system integration. Compared to the state of the art (DE 44 38 846 A1), in which wiring the stack of substrates to a metallization level of the bottom substrate and wiring by means of the via holes and wiring additional contact holes next to the stack to a metallization level of the top substrate must be done by means of additional printed circuits, the method in the invention makes the electrical connection by means of metal structures to be contacted that lie directly atop one another.

For this, the side walls of the via holes are preferably insulated initially by the deposition of $SiO_2$, for example, and then the surface of the uppermost metallization level is exposed, thus creating contact surfaces for the metal structures on the uppermost metallization level which are penetrated by the via holes. This can be done, without imposing limits on the invention as a whole, by means of chemical etching (back etching), and/or by mechanical, and/or chemical-mechanical grinding (thus, without a lithographic step). Then, conductive material is deposited onto the surface and into the via holes of the substrate stack, and in one preferred embodiment, removed again from the surface of the top substrate by means of chemical etching and/or mechanical, and/or chemical-mechanical grinding, so that the via holes continue to be filled with conductive material (the so-called plug technique). Then, by means of a standard metallizing step, for example by depositing and structuring an aluminum alloy, subsequent passivation and opening of bond pads, the wiring of the substrate stack, and thus vertical system integration, is completed. In another embodiment, the contact to the uppermost metallization level of the top substrate is created after a corresponding lithography step by means of structured etching and a subsequent standard metallizing step.

A basic simplification of the wiring method for the vertical system integration described above can be achieved by connecting an incompletely metallized top substrate to the bottom substrate, provided that the component substrates to be integrated vertically are not finish-processed before stacking. In the process, production of the top substrate is stopped just before the processing of the uppermost metal level, and it is not concluded until after stacking the top and bottom substrate in one step, with wiring the filled via holes. Before connecting the top and bottom substrates, the via holes are opened at those points, in the case of the top substrate, at which the corresponding metal structures of the uppermost metallization level are later generated, so that the latter make direct contact with the via holes, which are filled with conductive material, when the stack of substrates is wired.

BRIEF DESCRIPTION OF THE SEVERAL VIEWS OF THE DRAWINGS

The method in the invention is described in greater detail below using an example of embodiment and the corresponding drawings.

DETAILED DESCRIPTION OF THE INVENTION

The method can be used with standard CMOS-compatible semiconductor technology and compared to the known methods, it makes it possible to cut production costs and basically enhance closely integrated microelectronic systems. This invention also concerns a vertical integrated-circuit structure.

Figure 1:
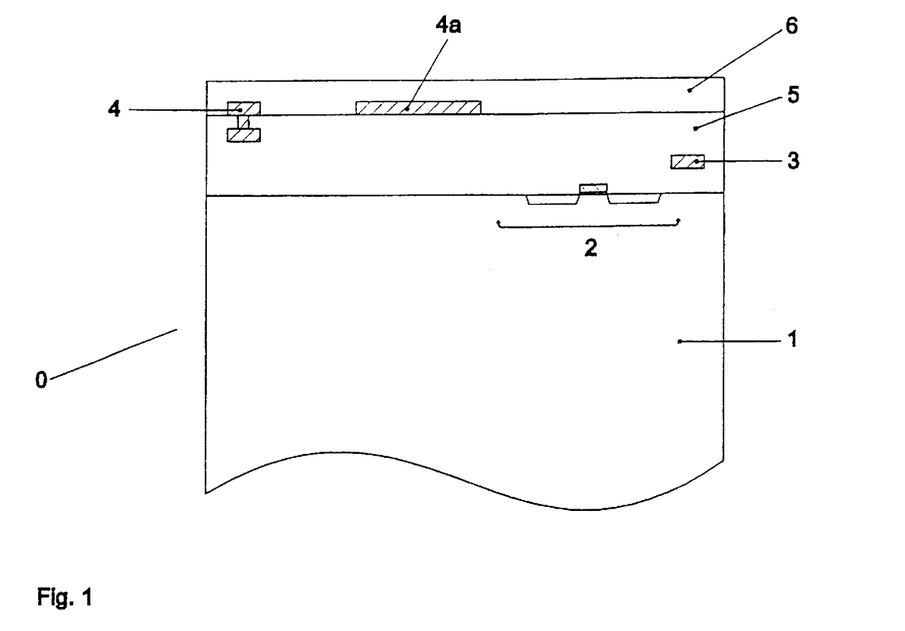
FIG. 1 shows the finish-processed top substrate before the opening of a via hole.
Figure 2:
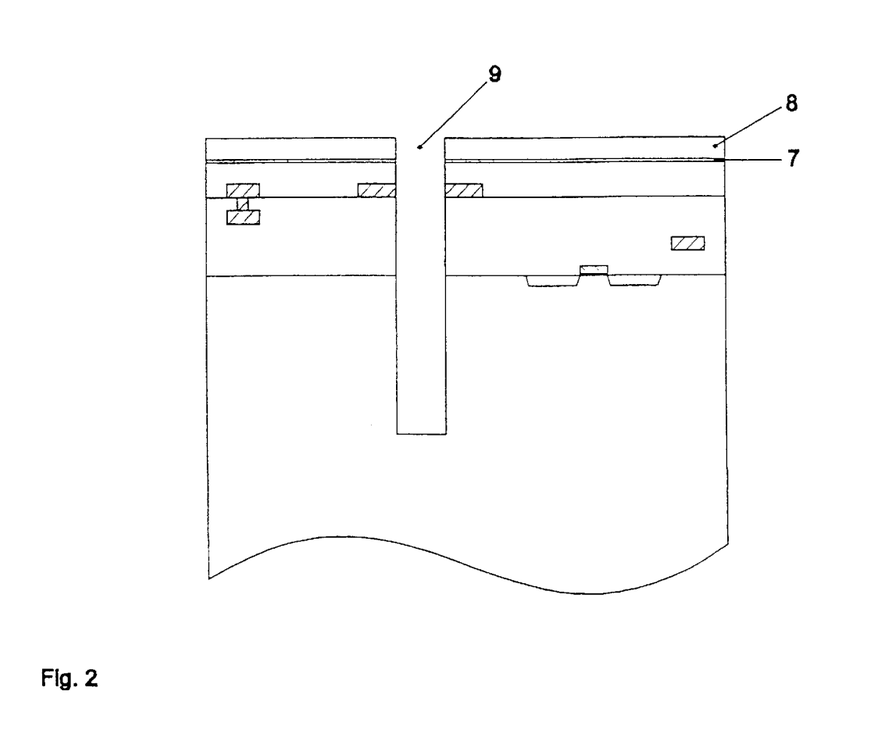
FIG. 2 shows the finish-processed top substrate after the opening of a via hole.

In FIG. 1, the reference symbol 0 refers to the top substrate which, in this example, is a bulk silicon wafer 1 with finish-processed MOS circuits 2 and one or more metallization levels 3, 4, 4a, which are typically composed of an aluminum alloy and which, for purposes of electrical insulation, are surrounded by a dielectric layer 5, for example, an inter-metallic dielectric. The uppermost metallization level is typically covered over by a dielectric passivating layer 6, which can also have a planarizing function. Initially, titanium nitride 7 and silicon dioxide 8 are deposited as masking layers (so-called hard mask) for subsequent dry etching, and a photo technique is used for the via holes 9. With the aid of a lacquer mask, the silicon oxide 8 and the titanium nitride 7, and dielectric layers 5 under them, are etched by anisotropic means. After the removal of the lacquer, in the so-called trench etching method, the etching is done up to a few micrometers into the monocrystalline silicon, in the course of which the silicon oxide layer 8 serves as masking (hard mask). The result is shown in FIG. 2.

The top substrate 0 is now thinned mechanically, if necessary, from the back. At that time, if necessary, using an organic adhesive layer 10, a silicon wafer 11 can be glued onto the top substrate as a handling substrate, and then the top substrate 0 can be thinned by wet chemical means, and/or by chemical-mechanical means from the back as far as the via holes, so that the latter are opened from the back, as shown at the top of FIG. 3.

Figure 3:
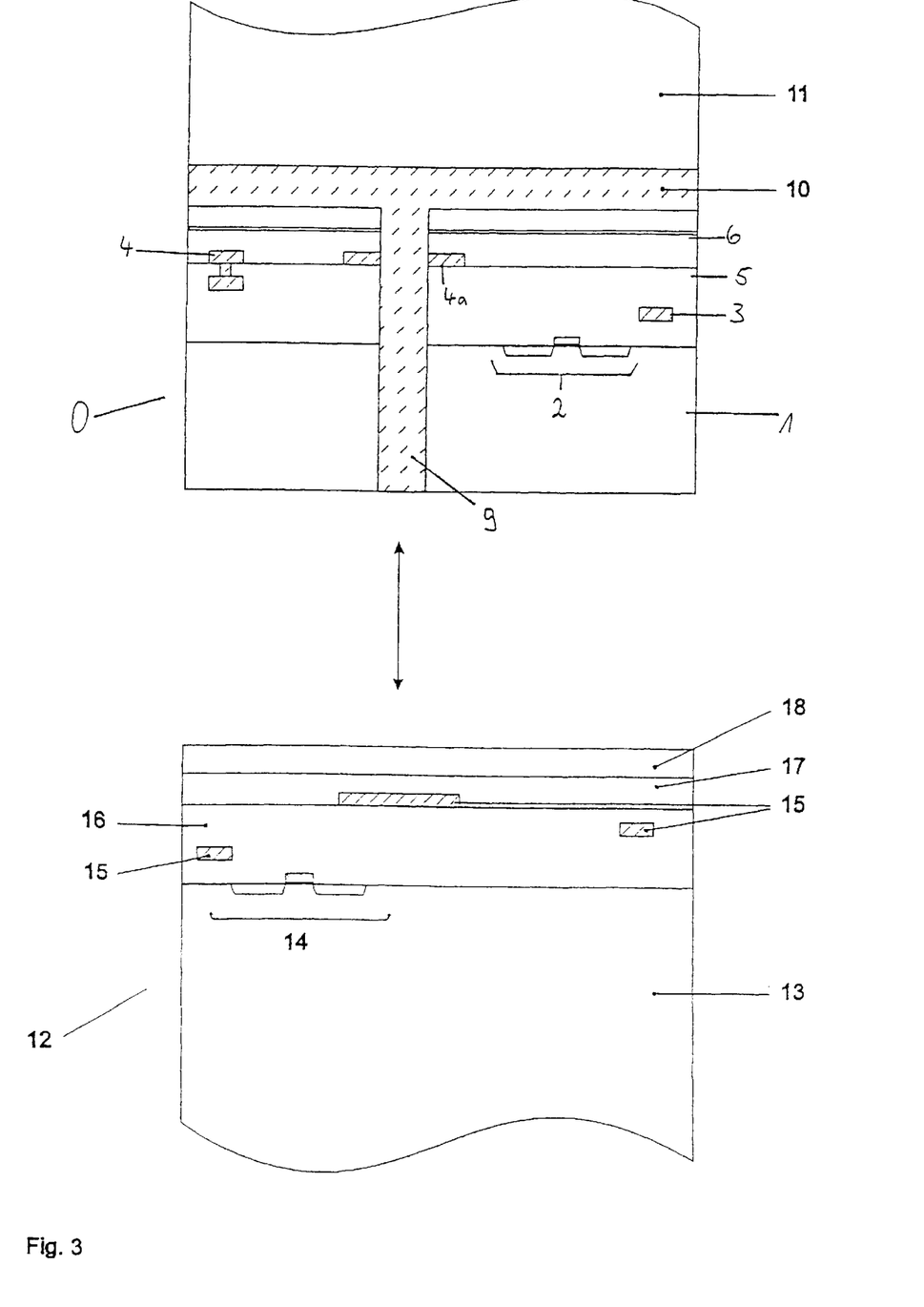
FIG. 3 shows the step that joins the top substrate and the bottom substrate.

Onto the bottom substrate 12, which is comprised of a bulk silicon wafer 13 with finish-processed MOS circuits 14 and one or more metallization levels 15, which typically consist of an aluminum alloy and are surrounded, for purposes of electrical insulation, by a. dielectric layer 16, the surface of which is also passivated and planarized with a planarized passivation layer 17, a polyimide layer 18 is deposited as a connective layer, as is shown at the bottom of FIG. 3. Then the aligned connection of top substrate 1 and bottom substrate 12 take place in a disc-bonding device (see FIG. 3).

Figure 4:
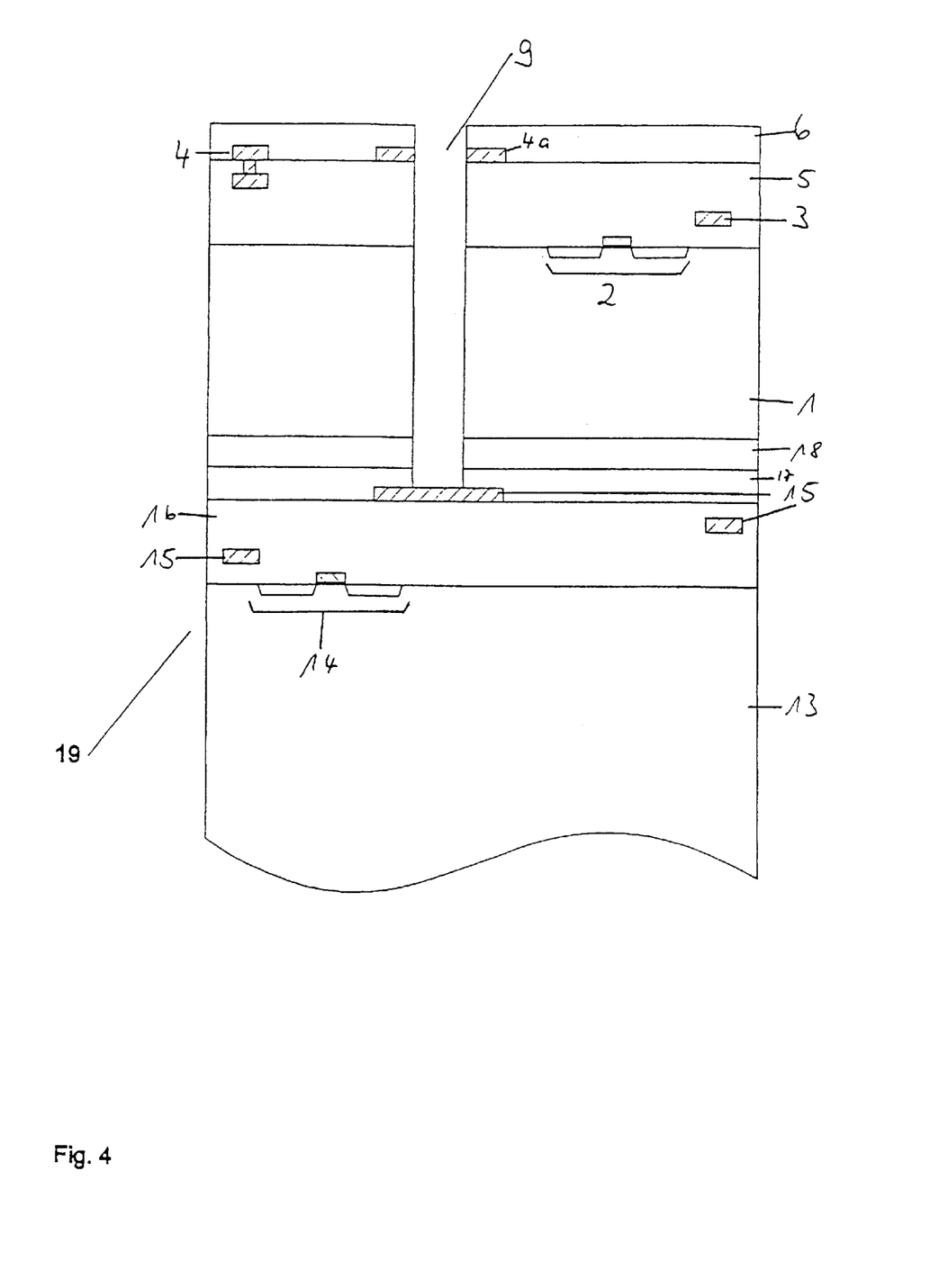
FIG. 4 shows the joined substrates with a more deeply etched via hole.
Figure 5:
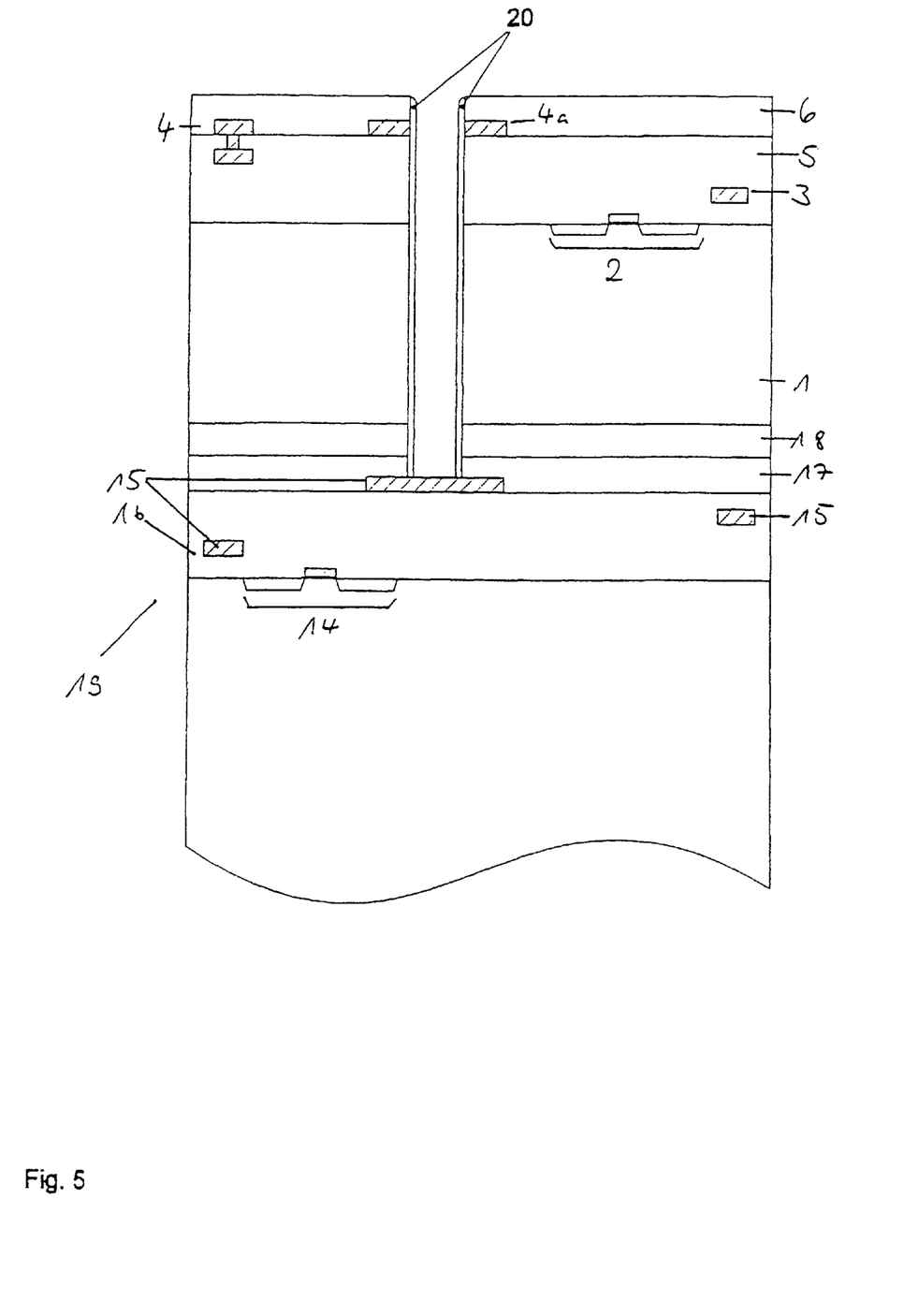
FIG. 5 shows the joined substrates with an insulated via hole.

After the removal of the handling substrate 11 and the adhesive layer 10, the resultant stack of wafers 19 can be processed further as a standard silicon wafer. As is shown in FIG. 4, the connecting layer 18 and the passivating layer 17 are etched anisotropically by way of the metal structures 15 in the via holes 9; the titanium nitride layer 7 serves as masking for the dry etching process and is later removed. As shown in FIG. 5, by means of conforming oxide deposition and then a highly directed dry-etching process (so-called spacer etching process), the insulation on the side walls of the via holes, which includes, for example, a spacer oxide 20, is made.

Figure 6:
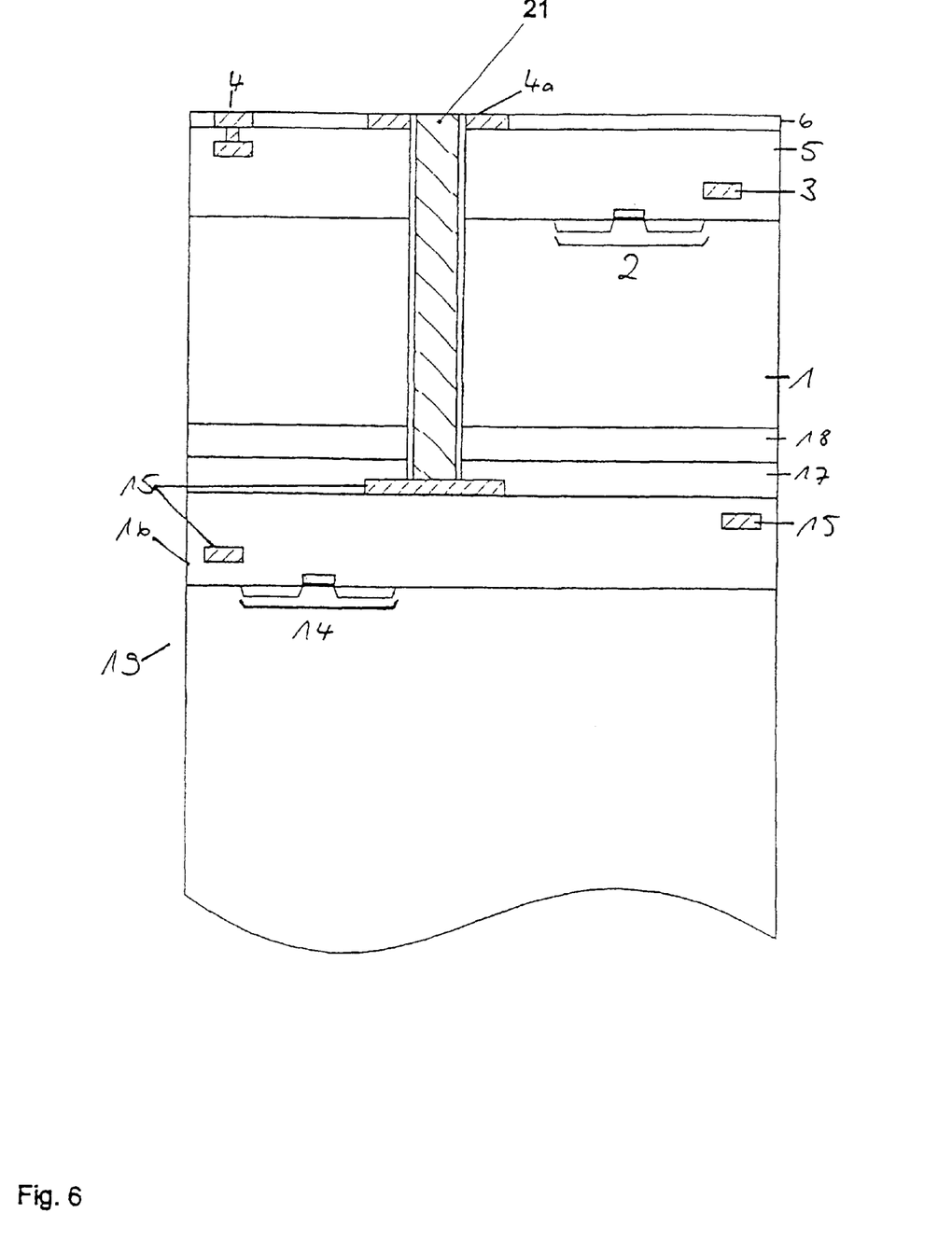
FIG. 6 shows the via hole filled with metallic material.
Figure 7:
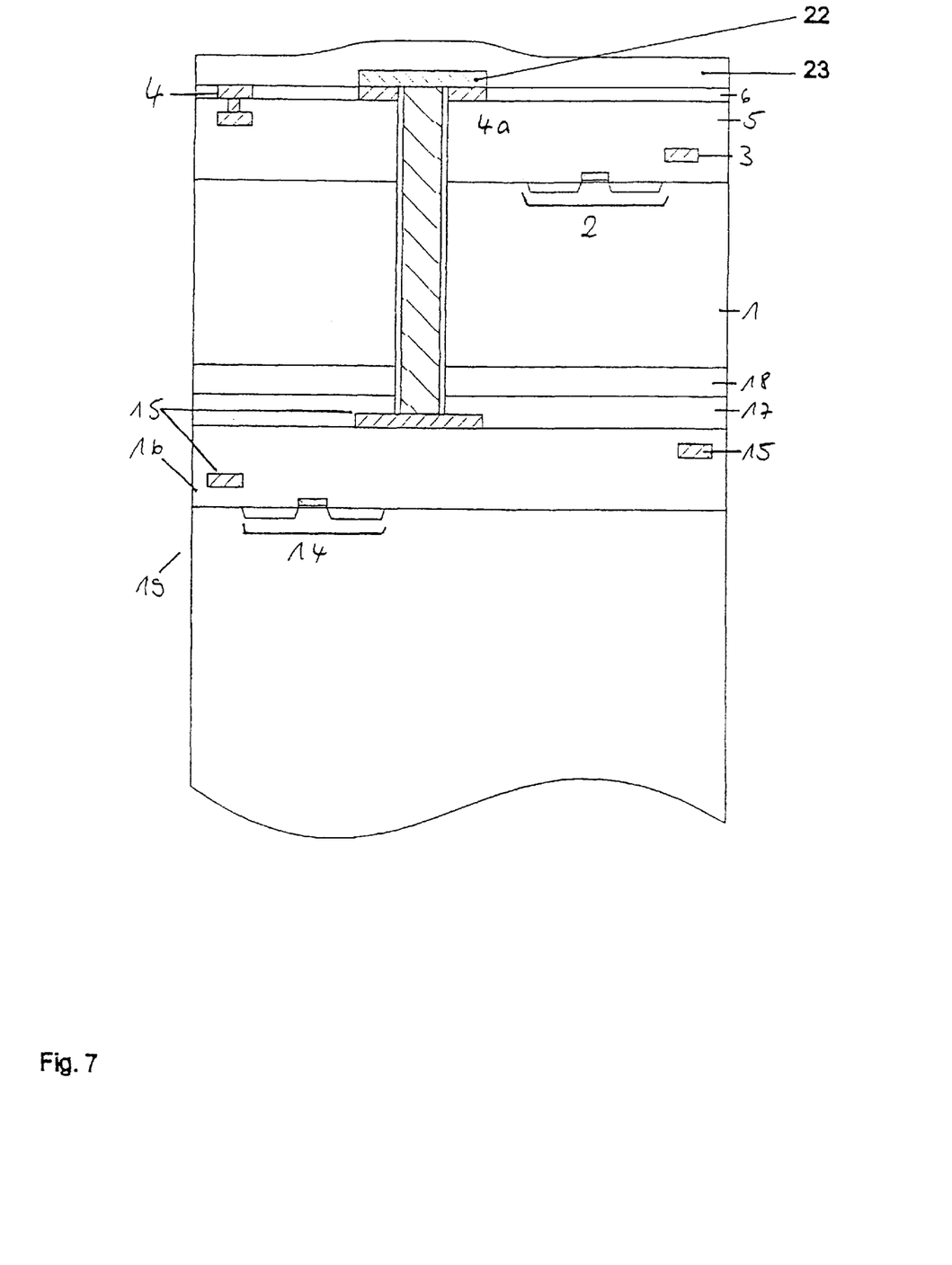
FIG. 7 shows the finish-processed substrate stack, with contacts established.

Then the contact surfaces 4a of the uppermost metallization level 4 are exposed by chemical-mechanical grinding and tungsten is deposited onto the surface of the substrate stack 19 and into the via holes and, by means of chemical etching (the so-called plug technique), it is removed again from the surface of the top substrate, so that the via holes continue to be filled with conductive material 21, tungsten, for example, as shown in FIG. 6. Then, as is shown in FIG. 7, the contact between the metallization levels of the bottom substrate 15 and the uppermost metallization level 4 of the top metallizing is produced by means of deposition and corresponding structuring of an aluminum alloy 22. Finally, the substrate stack can be passivated with a dielectric layer 23, and bond pads can be opened by standard methods.

Figure 6A:
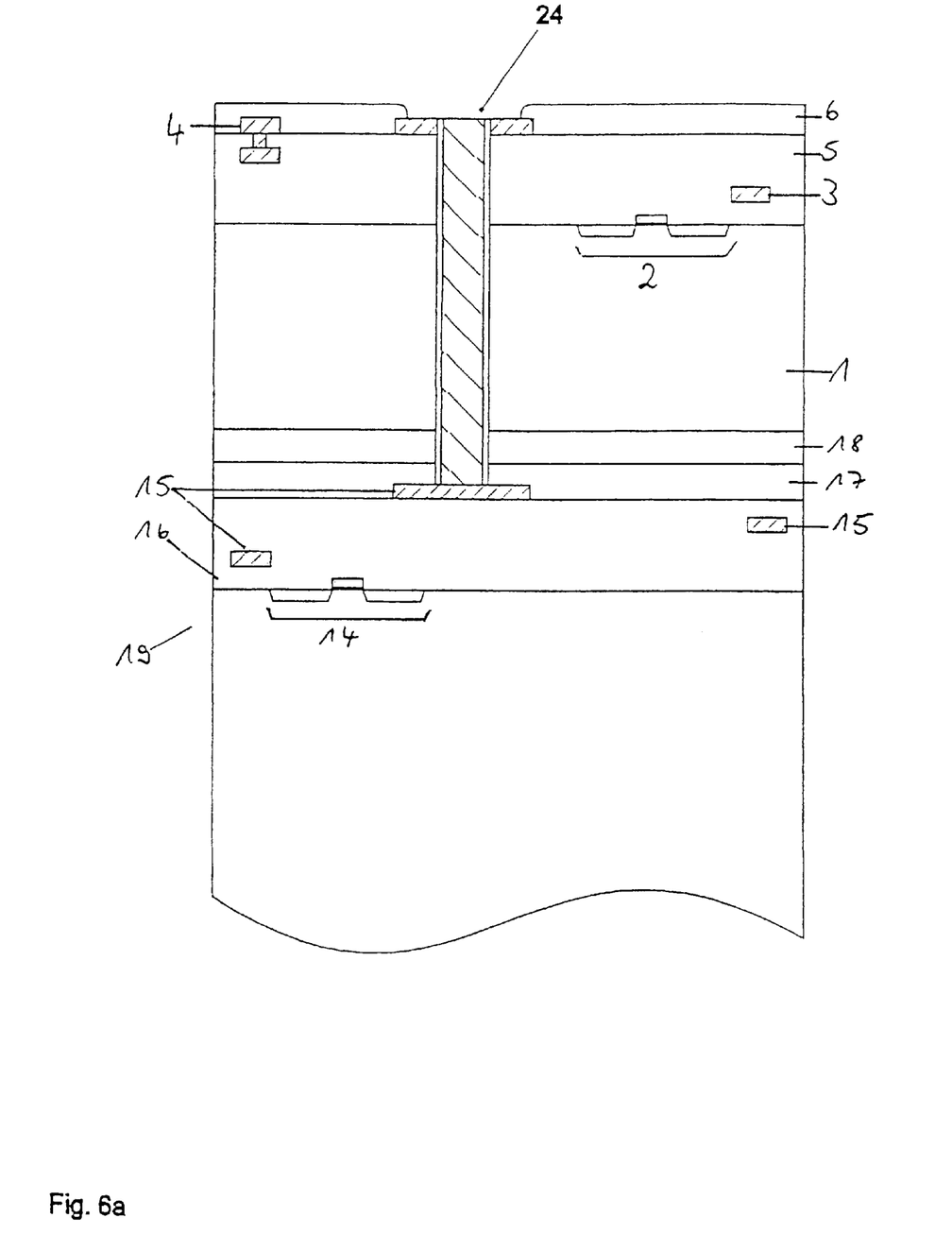
FIG. 6a shows the via hole according to another form of embodiment of this invention which is filled with metallic material.
Figure 7A:
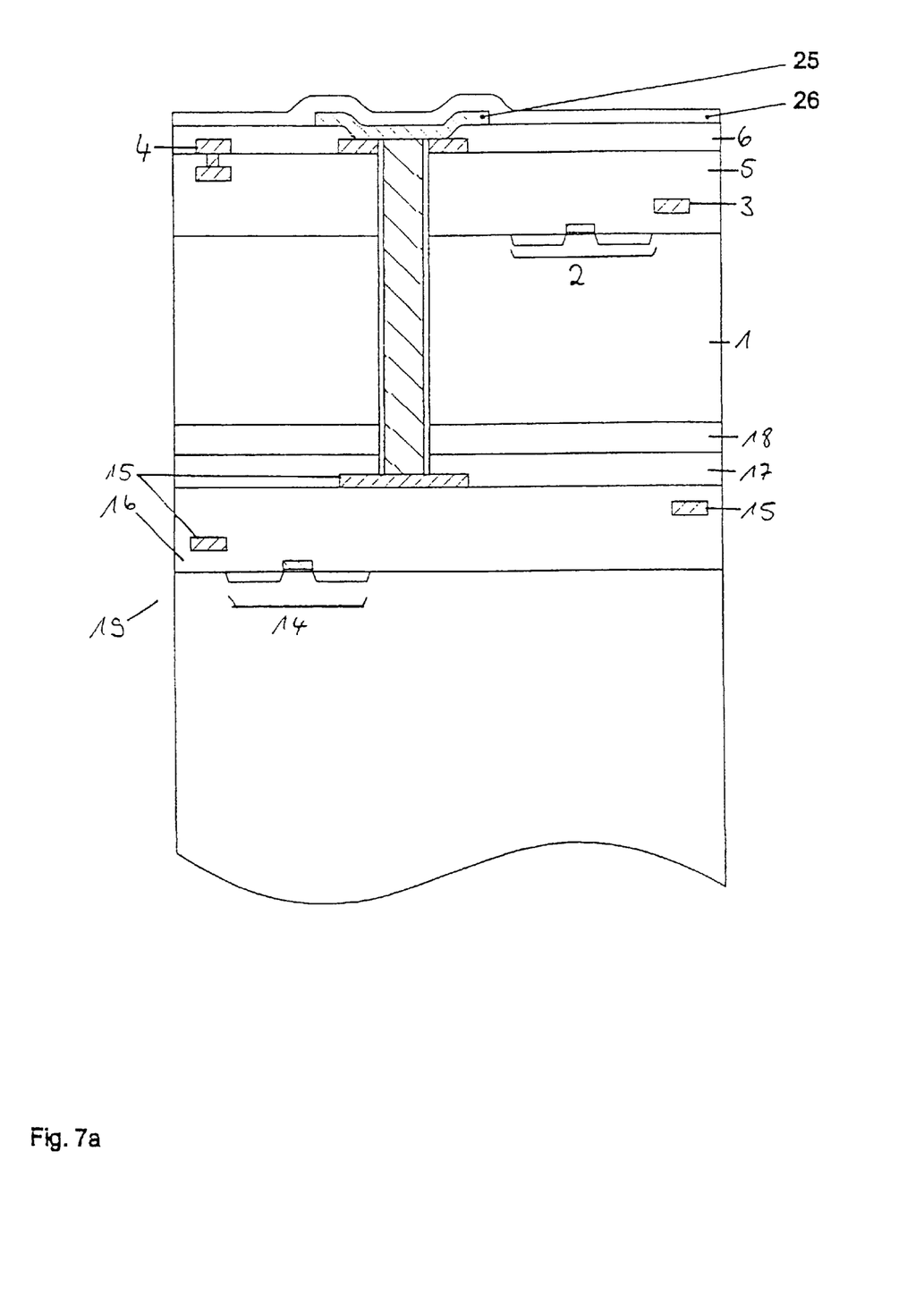
FIG. 7a shows the finish-processed substrate stack, with contacts established, in the case of one preferred form of embodiment of the invention.

In another form of embodiment, which is shown in FIGS. 6a and 7a, the contact to the uppermost metallization level of the top substrate is produced as follows: Taking FIG. 5 as a point of departure, the via hole is filled up with a metallic material, such as tungsten, for example, and it is removed from the surface of the top substrate again by means of chemical etching (the so-called plug technique), so that the via holes continue to be filled with conductive material 21. Then, after a corresponding lithography step, contact surfaces 24 are opened on the metal structure 4. By means of a subsequent standard metallizing step, a metal coating 25 is produced that includes, for example, an aluminum alloy. FIG. 7a shows the wired stack of substrates after final passivation with a passivation layer 26 and opening of the bond pad.

What is claimed is:

1. A wiring method for producing a vertical integrated circuit structure with the steps for:

providing a first substrate, which contains, in the region of a first main area, one or more first layers with circuit structures and an uppermost flat metallizing surface;

opening of via holes in a first step to the region of the first main area of the first substrate;

providing a second substrate, which contains, in the region of a second main area, at least one layer with circuit structures, and at least one flat metallizing surface;

connecting the first substrate with the second substrate, such that the side of the first substrate which lies opposite that of the first main area, and the side of the second main area of the second substrate are guided together so as to be aligned;

opening, in a second step, the via holes that are present in the first substrate in a direct vertical line from the metallization area of the first substrate to a predetermined flat metallizing surface of the second substrate; and creating an electrically conductive connection between the uppermost flat metallizing surface of the first substrate and the predetermined flat metallizing surface of the second substrate by way of via holes, such that these steps are performed in the sequence indicated, characterized by the fact that the opening of the via holes occurs in such a manner that the via holes abut the uppermost flat metallizing surface.

2. A wiring method for the production of a vertical integrated circuit structure with the steps for:

providing a first substrate, which contains, in the region of a first main area one or more first layers with circuit structures, and whose uppermost flat metallizing surface is not completed;

opening via holes in a first step in the region of the first main area of the first substrate;

providing a second substrate, which contains, in the region of a second main area, at least one layer with circuit structures and at least one flat metallizing surface;

connecting the first substrate with the second substrate, such that the side of the first substrate, which lies opposite the first main area, and the side of the second main area of the second substrate are guided together so as to be aligned;

opening, in a second step, the via holes that are present in the first substrate in a direct vertical line from the metallization area of the first substrate to a predetermined flat metallizing surface of the second substrate; and introducing a metallic material into the via holes, as well as selective metallization of the surface, as a result of which an uppermost flat metallizing surface of the first substrate is brought into contact with the predetermined flat metallizing surface of the second substrate by means of the metallic material in the via holes, such that the opening of via holes occurs in such a manner that the via holes abut the uppermost flat metallizing surface and the steps are performed in the sequence that is indicated.

3. A process according to claim 1, further comprising: connecting the first substrate with an auxiliary substrate on the side of the first main area prior to providing the second substrate; and removing the auxiliary substrate after connecting the first substrate with the second substrate.

4. A process according to claim 3, characterized by the fact that the first substrate is connected to the auxiliary substrate by way of an adhesive layer.

5. A process according to claim 4, characterized by the fact that an adhesive layer that is passivating and/or planarizing is used.

6. A process according to claim 1, characterized by the fact that
in the region of the first main area of the first substrate, a first set of alignment marks is produced, which penetrate the first layers of the circuit structures,
the second substrate contains a second set of alignment marks in the region of the second main area, and
the guiding together, in alignment, of the first and second substrate is accomplished by means of split optics and by virtue of the alignment marks in the range of the visible spectrum.

7. A process according to claim 6, characterized by the fact that the first alignment marks are etched through the first layers of the circuit structures and the second alignment marks are metallic structures in the second flat metallizing surface of the second substrate.

8. A process according to claim 1, characterized by the fact that the opening of the via holes is accomplished by means of etching.

9. A process according to claim 1, characterized by the fact that the via holes are opened in such a way in the first step that they penetrate all first layers with circuit structures.

10. A process according to claim 9, characterized by the fact that the via holes in the first step are opened as far as a few micrometers below the first layers of the circuit structures.

11. A process according to claim 1, characterized by the fact that the first substrate is an SOI substrate.

12. A process according to claim 1, characterized by at least one step for thinning the first substrate before joining together with the second substrate.

13. A process according to claim 12, in which the via holes in the first step are opened as far as a few micrometers below the first layers of the circuit structures, characterized by the fact that the thinning of the first substrate occurs as far as the via holes.

14. A process according to claim 12, in which the first substrate is an SOI substrate, characterized by the fact that the via holes are opened in the first step as far as the oxide layer of the SOI substrate, and the thinning of the first substrate takes place as far as this oxide layer.

15. A process according to claim 12, characterized by the fact that the thinning of the first substrate occurs by means of etching, grinding, and/or chemo-mechanical polishing.

16. A process according to claim 1, characterized by the fact that the connecting of the substrates occurs by means of a transparent adhesive layer that is applied to the second main area of the second substrate and/or to the side of the first substrate that lies opposite the first main area.

17. A process according to claim 16, characterized by the fact that a passivating and/or planarizing adhesive layer is used.

18. A process according to claim 1, characterized by the fact that the creation of an electrically conductive connection between the first or uppermost flat metallizing surface of the first substrate and the predetermined flat metallizing surface of the second substrate comprises the following processing steps:
exposing a portion of the first or uppermost flat metallizing surface;
deposition of a connective material into the via holes and onto the surface of substrate stack;
removal of the connective material from the surface of the substrate stack;
selective application of a metallizing material between the portion of the first or uppermost flat metallizing surface and the connective material.

19. A process according to claim 1, characterized by the fact that the production of an electrically conductive connection between the first or uppermost flat metallizing surface of the first substrate and the predetermined flat metallizing surface of the second substrate comprises the following processing steps:
deposition of a connection material into the via holes and onto the surface of the substrate stack;
removal of the connection material from the surface of the substrate stack;
partial exposure of parts of the first or uppermost flat metallizing surface; and
selective application of a metallizing material between the parts of the first flat metallizing surface and the connecting materials.

20. A process according to claim 18, characterized by the fact that the removal of the connection material occurs by means of chemical etching, mechanical and/or chemo-mechanical grinding.

21. A process according to claim 1, further comprising applying a passivating material creating the electrically conductive connection between the first or uppermost flat metallizing surface of the first substrate and predetermined flat metallizing surface of the second substrate.

22. A process according to claim 21, further comprising opening a connective opening to the metallizing material between the portion of the flat metallizing surface and the connection material after applying the passivating material.

23. A vertical, integrated circuit structure, characterized by the fact that it is produced by means of the process according to claim 1.

24. A process according to claim 2, characterized by:
connecting the first substrate with an auxiliary substrate on the side of the first main area prior to providing the second substrate and removing the auxiliary substrate after connecting the first substrate with the second substrate;
the fact that the first substrate is connected to the auxiliary substrate by way of an adhesive layer;
the fact that an adhesive layer that is passivating and/or planarizing is used;
the fact that
in the region of the first main area of the first substrate, a first set of alignment marks is produced, which penetrate the first layers of the circuit structures,
the second substrate contains a second set of alignment marks in the region of the second main area, and
the guiding together, in alignment, of the first and second substrate is accomplished by means of split optics and by virtue of the alignment marks in the range of the visible spectrum;
the fact that the first alignment marks are etched through the first layers of the circuit structures and the second alignment marks are metallic structures in the second flat metallizing surface of the second substrate;
the fact that the opening of the via holes is accomplished by means of etching;
the fact that the via holes are opened in such a way in the first step that they penetrate all first layers with circuit structures;

the fact that the via holes in the first step are opened as far as a few micrometers below the first layers of the circuit structures;

at least one step for thinning the first substrate before joining together with the second substrate.

25. A process according to claim 24, characterized by:

the fact that the first substrate is an SOI substrate;

the fact that either the via holes in the first step are opened as far as a few micrometers below the first layers of the circuit structures or that the via holes are opened in the first step as far as the oxide layer of the SOI substrate, and the thinning of the first substrate takes place as far as this oxide layer and characterized by the fact that the thinning of the first substrate occurs as far as the via holes;

the fact that the thinning of the first substrate occurs by means of etching, grinding, and/or chemo-mechanical polishing;

the fact that the connecting of the substrates occurs by means of a transparent adhesive layer that is applied to the second main area of the second substrate and/or to the side of the first substrate that lies opposite the first main area;

the fact that a passivating and/or planarizing adhesive layer is used.

26. A process according to claim 25, characterized by:

the fact that the creation of an electrically conductive connection between the first or uppermost flat metallizing surface of the first substrate and the predetermined flat metallizing surface of the second substrate comprises the following processing steps:

exposing a portion of the first or uppermost flat metallizing surface;

deposition of a connective material into the via holes and onto the surface of substrate stack;

removal of the connective material from the surface of the substrate stack;

selective application of a metallizing material between the portion of the first or uppermost flat metallizing surface and the connective material.

27. A process according to claim 25, characterized by:

the fact that the production of an electrically conductive connection between the first or uppermost flat metallizing surface of the first substrate and the predetermined flat metallizing surface of the second substrate comprises the following processing steps:

deposition of a connection material into the via holes and onto the surface of the substrate stack;

removal of the connection material from the surface of the substrate stack;

partial exposure of parts of the first or uppermost flat metallizing surface; and selective application of a metallizing material between the parts of the flat metallizing surface and the connecting material.

28. A process according to claim 26, characterized by:

the fact that the removal of the connection material occurs by means of chemical etching, mechanical and/or chemo-mechanical grinding;

applying a passivating material after the step to create the electrically conductive connection between the first or uppermost flat metallizing surface of the first substrate and predetermined flat metallizing surface of the second substrate;

opening a connective opening to the metallizing material between the portion of the flat metallizing surface and the connection material after the step to apply the passivating material.

29. A process according to claim 27, characterized by:

the fact that the removal of the connection material occurs by means of chemical etching, mechanical and/or chemo-mechanical grinding;

applying a passivating material after the step to create the electrically conductive connection between the first or uppermost flat metallizing surface of the first substrate and predetermined flat metallizing surface of the second substrate;

opening a connective opening to the metallizing material between the portion of the flat metallizing surface and the connection material after the step to apply the passivating material.

30. A vertical, integrated circuit structure, characterized by the fact that it is produced by means of the process according to claim 28.

31. A vertical, integrated circuit structure, characterized by the fact that it is produced by means of the process according to claim 29.

* * * * *

UNITED STATES PATENT AND TRADEMARK OFFICE
CERTIFICATE OF CORRECTION

PATENT NO.    : 6,448,174 B1                                    Page 1 of 1
DATED         : September 10, 2002
INVENTOR(S)   : Peter Ramm It is certified that error appears in the above-identified patent and that said Letters Patent is hereby corrected as shown below:

Column 1, after line 48, insert the following title -- BRIEF SUMMARY OF THE INVENTION --.

Signed and Sealed this

Second Day of September, 2003

JAMES E. ROGAN
*Director of the United States Patent and Trademark Office*